(12) United States Patent
Xue et al.

(10) Patent No.: US 9,966,661 B2
(45) Date of Patent: May 8, 2018

(54) PHASED ARRAY, A COHERENT SOURCE ARRAY, AN ANTENNA ARRAY AND A SYSTEM FOR CONTROLLING THEREOF

(71) Applicant: City University of Hong Kong, Kowloon (HK)

(72) Inventors: Quan Xue, Kowloon (HK); Chengcheng Tang, Kowloon (HK)

(73) Assignee: City University of Hong Kong, Kowloon (HK)

( * ) Notice: Subject to any disclaimer, the term of this patent is extended or adjusted under 35 U.S.C. 154(b) by 861 days.

(21) Appl. No.: 13/973,443

(22) Filed: Aug. 22, 2013

(65) Prior Publication Data

US 2014/0097986 A1  Apr. 10, 2014

Related U.S. Application Data

(60) Provisional application No. 61/692,917, filed on Aug. 24, 2012.

(51) Int. Cl.
*H01Q 3/34* (2006.01)

(52) U.S. Cl.
CPC .................... *H01Q 3/34* (2013.01)

(58) Field of Classification Search
CPC ........................................................ H01Q 3/34
USPC ........................................................ 342/372
See application file for complete search history.

(56) References Cited

U.S. PATENT DOCUMENTS

| | | | | |
|---|---|---|---|---|
| 5,391,996 A | * | 2/1995 | Marz ................. | H03L 7/081 327/158 |
| 2008/0265999 A1 | * | 10/2008 | Wan .................. | H03L 7/07 331/16 |
| 2008/0297414 A1 | * | 12/2008 | Krishnaswamy ... | H01Q 3/28 342/368 |
| 2010/0112943 A1 | * | 5/2010 | Chia ................... | H01Q 1/2216 455/41.2 |

* cited by examiner

*Primary Examiner* — Tashiana R Adams
*Assistant Examiner* — Helena H Seraydaryan
(74) *Attorney, Agent, or Firm* — Renner Kenner Greive Bobak Taylor & Weber

(57) ABSTRACT

A system for controlling a multi-element antenna array comprising a plurality of elements each arranged to receive a signal from a signal source, wherein each of the plurality of elements includes a frequency locking module arranged to lock the frequency of the signal received by each of the elements, and, a phase control module being in communication with each of the frequency locking modules to control the phase of the signal received by each of the elements.

16 Claims, 10 Drawing Sheets

PHASED ARRAY, A COHERENT SOURCE ARRAY, AN ANTENNA ARRAY AND A SYSTEM FOR CONTROLLING THEREOF

CROSS-REFERENCE TO RELATED APPLICATIONS

The present application claims the benefit of U.S. Provisional Patent Application No. 61/692,917, filed Aug. 24, 2012.

TECHNICAL FIELD

This invention relates to a system for controlling an antenna array, and particularly, although not exclusively, to a system arranged to control a multi-element antenna array, a phased array or a coherent source array with a dual phase-locked loop infrastructure.

BACKGROUND

Multi-element antennas are antennas which have multiple radiating elements which are each arranged to radiate a signal. These antennas can be controlled to electronically steer a signal without a physical adjustment to the radiating elements. In recent times, attempts have been made by engineers and researchers to process and control the signals of each element, such as by phase and amplitude controlling through high frequency components or DSP controlling at baseband, so that the multi-element antenna array is able to perform various functions in radio, telecommunications, computer, medical devices and other electronic applications.

Despite these attempts, operations of the multi-element antenna arrays are limited. In part, this is due to the fact that components used to process and control the signals within each element are affected by aging and environmental factors during their operation and thus causes problematic processing and control of signals to perform a specific task successfully.

SUMMARY OF THE INVENTION

In accordance with one aspect of the present invention, there is provided a phased antenna array comprising: one or more phase source units, a phase detector array and a controller unit arranged to interface the phase source units and the phase detector array.

In an embodiment, the one or more phase source units plus the novel phase detector array include a dual loop phase-locked loop (PLL) arrangement.

One of these embodiments are at least advantageous in that groups of PLLs act as an array of coherent-sources based on their capability of not only providing frequency and phase tracking on single module, but also achieve multi-PLL synchronization among the whole system. In addition, its low cost precise phase control on system level would make itself a better candidate for phased array application.

In another embodiment, there is provided a novel dual-loop PLL infrastructure comprising a PLL loop and a micro controller unit (MCU) controlled phase detector array (PDA) loop. This arrangement is arranged to provide real-time calibration on both frequency and phase by reducing the effect of components aging and environmental issues.

In accordance with a second aspect of the present invention, there is provided a system for controlling a multi-element antenna array comprising: a plurality of elements each arranged to transmit a signal from a signal source, wherein each of the plurality of elements includes a frequency locking module arranged to lock the frequency of the signal transmitted by each of the elements; and, a phase control module being in communication with each of the frequency locking modules to control the phase of the signal transmitted by each of the elements.

In an embodiment of the second aspect, the phase control module is arranged to control the phase of the signal transmitted by each of the elements by: determining a phase adjustment value for each of the signals transmitted by each of the elements; and, applying the phase adjustment value to shift the phase of the signal.

In an embodiment of the second aspect, the phase control module uses a low cost phase shifting circuit at low frequency to shift the phase of the signal at high frequency to generate a phase shifted signal.

In an embodiment of the second aspect, the phase adjustment value is determined by using a phase difference determined by comparing the phase of the signals of two or more elements of the multi-element antenna array.

In an embodiment of the second aspect, the two or more elements are adjacent to each other in the multi-element antenna array.

In an embodiment of the second aspect, the phase shifting circuit feeds the phase shifted signal back into the frequency locking module.

In an embodiment of the second aspect, a signal divider circuit is disposed between the frequency locking module of each of the plurality of elements and the phase control module to direct the signal of each of the plurality of elements to the phase control module.

In an embodiment of the second aspect, the signal divider circuit is further arranged to direct the signal to a radiating member.

In an embodiment of the second aspect, an amplifying circuit is disposed between the signal divider and the radiating member to control the signal's power for radiation by the radiating member.

In an embodiment of the second aspect, a modulator is disposed between the signal divider circuit and the radiating member to modulate the signal with data information.

In an embodiment of the second aspect, the frequency locking module includes a phase locked loop synthesizer.

In an embodiment of the second aspect, the phase control module includes a phase shifter circuit, a phase detector array and a processor.

In an embodiment of the second aspect, the phase detector array is arranged to detect a phase difference between two or more signals by comparing the phase of the two or more signals.

In an embodiment of the second aspect, the processor is arranged to determine the phase adjustment value by using the phase difference between two or more signals.

In an embodiment of the second aspect, the processor is arranged to determine the phase adjustment value by determining a phase shift to be applied to the signal so as to minimize the phase difference between two or more signals.

In an embodiment of the second aspect, the processor determines the phase adjustment value by calculating a phase shift to be applied to the signal so as to shift the phase of the signal to reach an optimized phase.

In an embodiment of the second aspect, the optimized phase is a phase in which the signal radiated by a radiating element is steered into a desired direction In an embodiment of the second aspect, the two or more signals are the signals of two or more adjacent elements.

In an embodiment of the second aspect, the signal source is a common reference signal source.

In an embodiment of the second aspect, the frequency lock module operates in a loop.

In an embodiment of the second aspect, the phase control module operates in a loop.

In accordance with a second aspect of the present invention, there is provided a phased antenna array comprising:
- a frequency lock loop arranged to lock the frequency of a signal being transmitted by the antenna array; and
- a phase control loop arranged to shift the phase of the signal.

In an embodiment of the third aspect, the frequency lock loop is arranged to operate for each of a plurality of channels of the phase antenna array.

In an embodiment of the third aspect, the phase control loop is arranged to shift the phase of the signal of each of the plurality of channels by comparing the phase of the signal with the phase of a signal of an adjacent channel.

In an embodiment of the third aspect, the phase control loop is arranged to shift the phase of the signal to control the phase difference between any two or more adjacent channels.

In an embodiment of the third aspect, the signal is arranged to be steered in a desired direction when transmitted by the antenna array.

In an embodiment of the third aspect, the phase control loop includes a processor arranged to control a phase shifting circuit to shift the phase of the signal.

This embodiment is advantageous in that a phased transmitter array may have near-perfect LO beamforming performance and array pattern self-compensation realization are presented and analyzed. Due to analogue continues phase control and individual programmable transmit frequency, the dual-loop PLL based coherent-source array in this paper may offer considerable practical advantages when implementing beamforming, as compared to other beamforming techniques.

BRIEF DESCRIPTION OF THE DRAWINGS

Embodiments of the present invention will now be described, by way of example, with reference to the accompanying drawings in which.

DETAILED DESCRIPTION OF ILLUSTRATIVE EMBODIMENTS

Multi-element antenna arrays, including phased arrays are arranged to provide capabilities of beamforming and electronic steering by changing the relative phases of the signals transmitted or received by antennas. In order to achieve broadband phased-array operation, a true-time delay is required in each element. However, if the bandwidth of interest is narrow enough, it can make an approximation that the true-time delay, which is equivalent to a linear phase shift in the frequency domain, can be realized by a constant phase shift at the centre frequency.

Figure 1:
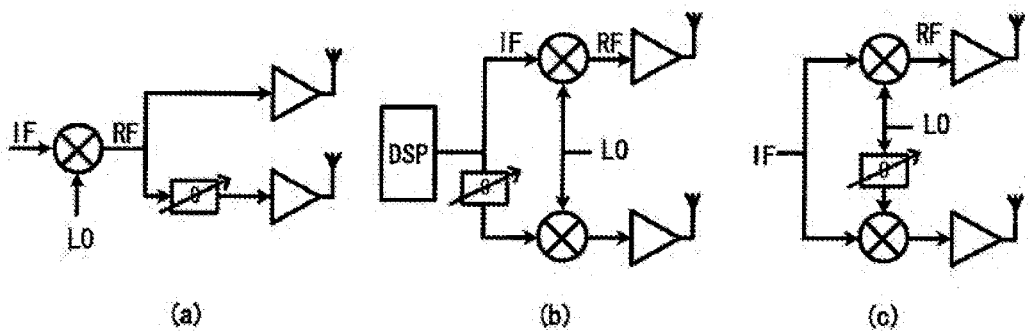
FIG. 1A is a diagram illustrating a Radio Frequency (RF) phase-shifting technique.
FIG. 1B is a diagram illustrating an intermediate frequency (IF) phase-shifting technique.
FIG. 1C is a diagram illustrating a Local Oscillator (LO) phase-shifting technique.

With reference to FIGS. 1(a), (b) and (c), phase-shifting techniques can generally be categorized into three types:

(a) RF phase shift: As shown in FIG. 1(a), this embodiment implements the required narrowband phase shift in each RF signal path through a RF phase shifter. These embodiments may suffer from high cost and sensitive loss to the whole system;

(b) IF phase shift: As shown in FIG. 1(b), in this embodiment, the delay and amplitude of the transmitted signal can be adjusted at the baseband using a digital processor. It then works as IF signal to be up-converted with LO signal, which involves large number of components, especially the expensive high sampling rate digital-to-analog converters (DACs)/analog-to-digital converters (ADCs), would increase the system's overall cost as well as face the performance bottleneck in digital processing; and, (c) LO phase shift: As shown in FIG. 1(c), in this embodiment, the phase shift is directly implemented in LO signal path, which has the advantage that it is relatively simple to ensure gain of each element does not vary with phase shift setting and it has low requirements on phase-shifter linearity, noise figure and bandwidth due to the low sensitivity of the mixer to the LO signals. As a result, LO beamforming, which involves LO phase shift architecture, these embodiments are generally more suitable for the phased array realization.

However, based on a review of the LO-based phase-shifting schemes in phased-array architecture, these techniques do encounter different challenges. In some examples, the centralized multiphase phase-locked loops (PLLs) technique has a high cost in large LO-phase distribution network, where multiple phases are coherently distributed to multiple front-ends. Although the local LO phase-shifting technique uses a single phase rotator at each element prior to the mixer stage at each front-end, the large distribution network bottleneck still exists, and the output power at each front-end would decrease as the number of the elements increases due to a fixed power at the input of the distribution network.

Injection-locked oscillator (ILO) array architecture employs injection locking to track the phase across a certain frequency range. However, this injection-locked frequency range is relatively small since it's limited by the power of the injected signal as well as the oscillator's Q-factor. In order to improve the locking range, a coupled-oscillator array minimizes the attenuation of the inter-injection signals among the coupled-oscillator array elements. Unfortunately, this scheme suffers from potential rapid degradation in the phase-noise performance with the increasing array size, especially when the oscillator array elements undergo frequency detuning due to variation of process, supply voltage and temperature (PVT).

Figure 3:
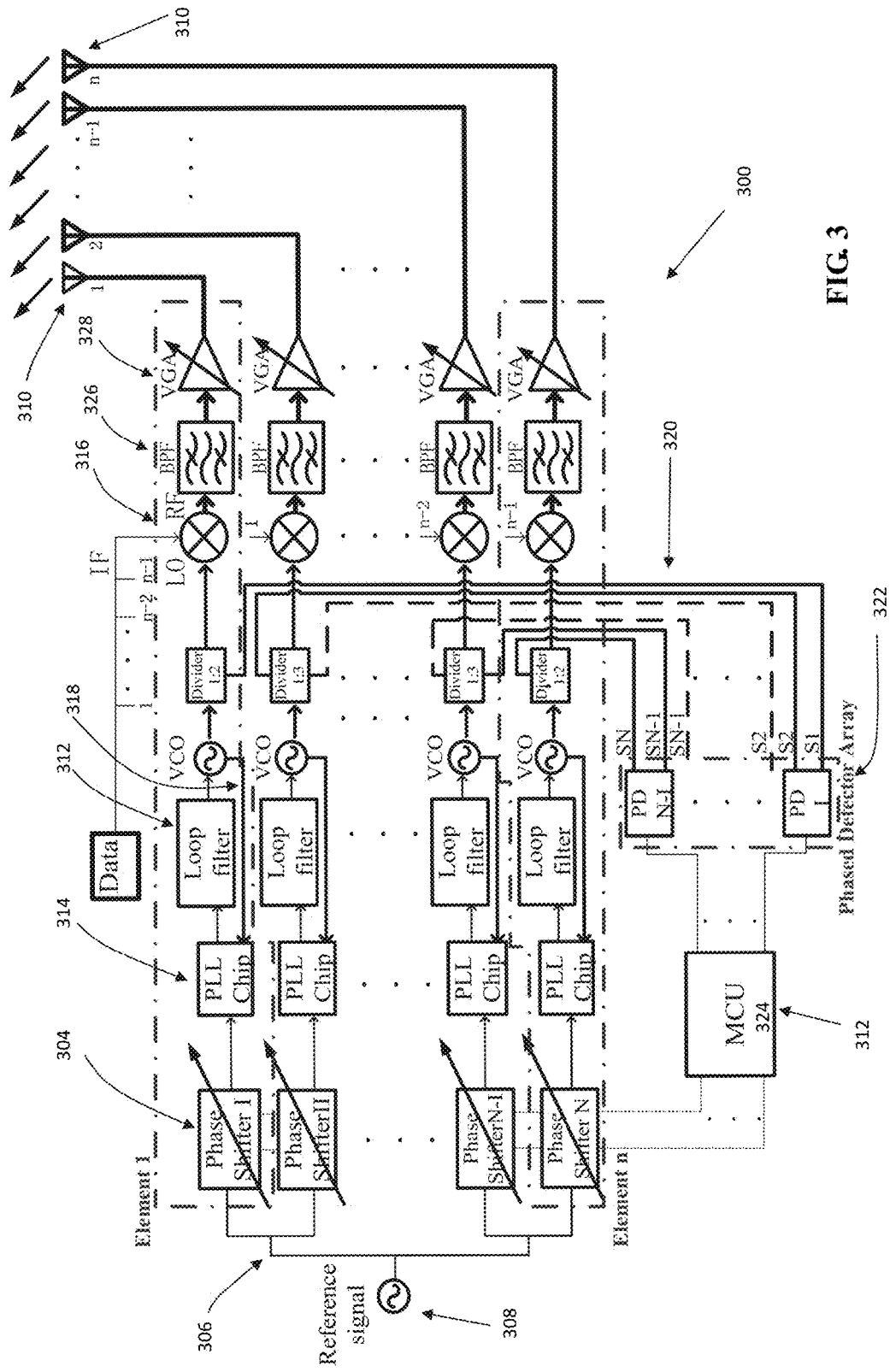
FIG. 3 is a schematic diagram illustrating an n-element coherent-source array in accordance with one embodiment of the invention.

With reference to FIG. 3, there is illustrated an embodiment of a system for controlling a multi-element antenna array comprising: a plurality of elements each arranged to transmit a signal from a signal source, wherein each of the plurality of elements includes a frequency locking module arranged to lock the frequency of the signal transmitted by each of the elements; and, a phase control module being in communication with each of the frequency locking modules to control the phase of the signal transmitted by each of the elements.

In the embodiments referred to in FIG. 3, the system 300 may also be referred to as a phased array or a n-element coherent source array when implemented in the embodiments shown in FIG. 3 to control the antenna array, although the system can be adopted to control other types of multi-element antennas.

In this embodiment, the signal source 302, which may be an example of a coherent signal source may achieve LO-beamforming realization through low frequency phase shifting scheme based on indirect controlled phased source method. This approach has a lower cost while also provides constant output power to the antenna elements 310 without lossy distribution network while also having no limitation on the locking range. In addition, in this example embodiment, the system includes a MCU controlled dual-loop infrastructure 312, wherein any phase error caused by variation of PVT as well as component aging and temperature drift issue can be calibrated, adjusted or shifted in real-time. As a result, this embodiment provides various advantages as a phased array realization example.

In the following sections of this description, embodiments of the system level and circuit level aspects in the design of the system for controlling a multi-element antenna array or also known as a coherent-source transmitter array will be described in detail below. A general description of the principle of the phased array will also be described, followed by an introduction to the architecture of the system for controlling a multi-element array.

In addition, the individual blocks of the system will also be described, followed by phased array's applications realized by an embodiment of the system with experimental results.

In this embodiment, with reference to FIG. 3, there is provided a system 300 for controlling a multi-element antenna array which is implemented as a phased array transmitter. In this example, the transmitter is constituted by plenty of radiating elements 310 each with a phase shifter 304. By shifting the phase of the signal emitted from each radiating element 310 to get a constructive interference, a beam can be formed in a desired direction. Electronic phase shifting achieves beam steering without actual mechanical reorientation of the antennas, which contributes to expanding the usage of the phased array in practice.

Figure 2:
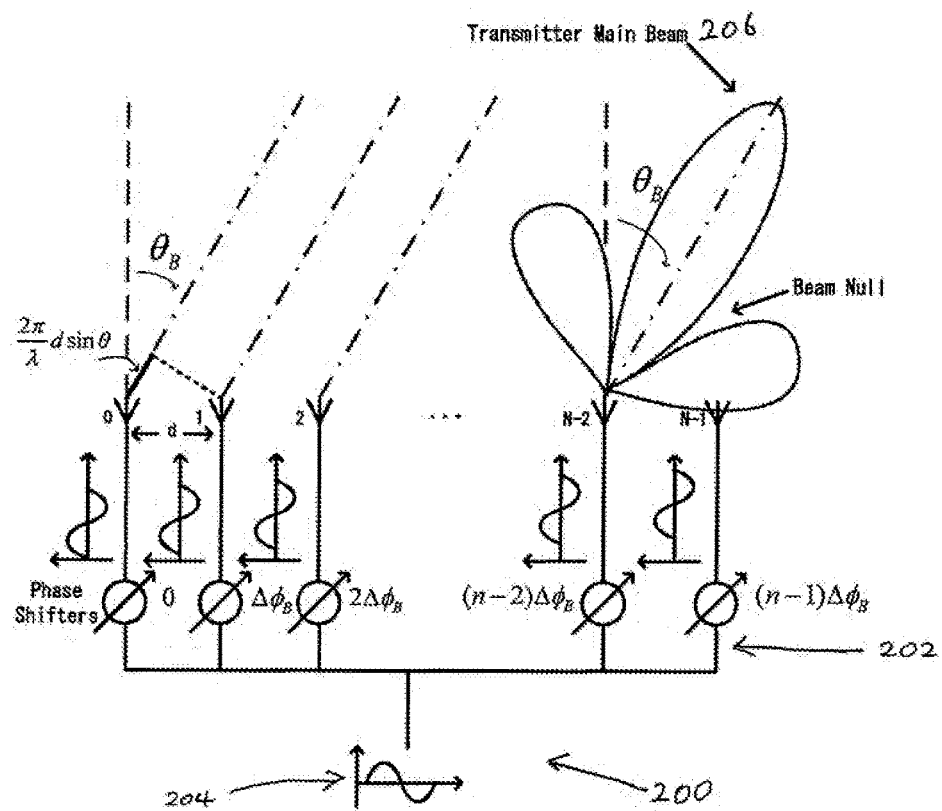
FIG. 2 is a schematic diagram illustrating a N-element phased array transmitter.

FIG. 2 shows a simplified linear n-element phased array transmitter 200, which consists of n antenna elements 202 equally spaced in series and electrically interconnected by a feeding network 204 that provides a constant adjacent phase difference $\Delta\varphi_B$ to achieve a steered main beam in the direction of $\theta_B$. According to the theory researched by the inventors, it is assumed that the antenna elements have identical isotropic radiation pattern, the radiation pattern of the array is:

$$F(\theta) = \sum_{i=0}^{N-1} a_i e^{ji\left(\frac{2\pi}{\lambda} d\sin\theta - \Delta\phi_B\right)} \tag{1}$$

where $$\Delta\phi_B = \frac{2\pi}{\lambda} d\sin\theta_B,$$

and $\theta_B$ is the direction of the main beam, which can be derived when $|F(\theta)|$ gets its maximum value from:

$$\sin\theta_B = \frac{\lambda}{2\pi d}\Delta\phi_B \tag{2}$$

or $$\theta_B = \arcsin\left(\frac{\lambda}{2\pi d}\Delta\phi_B\right)$$

As a result, one may steer $\theta_B$, the main beam of the array 206, by changing $\Delta\varphi_B$, the phase difference of the adjacent elements, only if the spacing distance between the adjacent antenna elements is fixed as d. In addition to concentrating power in a desired direction, in other directions $\theta(\theta \neq \theta_B)$, $|F(\theta)|$ is small or even zero, which ensures lower interference power at receivers that are not targeted. A better suppression at side-lobe could be achieved if weighted amplitude feeding is provided instead of uniform one, i.e. in (1), $a_i \neq a_j, i \neq j$. Phased array with beamforming and electronic beam-steering techniques can reject interfering signals, whose direction of arrival is different from that of a desired signal. Multi-polarized arrays can even reject interfering signals having the same direction of arrival but different polarization states from the desired signal. These capabilities enable phased array to improve the capacity of wireless communication system.

In one embodiment of the system 300 for controlling a multi-element array, which may be referred to as a coherent-source array after the system is implemented for controlling such an array. In some example embodiments, the architecture of the coherent-source array is discussed in depth. This is followed by a detailed description of the characteristic analysis in a system level.

In this embodiment, an example of an n-element coherent-source array's infrastructure is shown in FIG. 3. At the input port 306, each element shares a common reference signal 308, which passes through a low frequency phase shifter (LFPS) 304 before going into the PLL-based frequency synthesizer 314. The output signal from the synthesizer with a high frequency would, in this example, be divided into three paths:

the first path being with a major power is going into an up-converter to work as the LO signal 316;

the second path being with minor power is going into a feedback path for the phase comparison within the PLL loop (the first loop) for phase and frequency control 318; and the third path leads 320 to a phase detector array (PDA) 322 for real-time phase calibration (the second loop).

After modulated by an IF signal containing data information, the obtained RF signal would pass through a band pass filter (BPF) 326 and then be amplified by a variable gain amplifier (VGA) 328 at the final stage. The amplified signal would be finally feed to the antenna array for transmitting. Because of the common reference signal, the RF signals from all the elements are coherent so as to achieve beamforming controlled by a Microprocessing Unit (MCU) or processor 324.

As mentioned in earlier, an embodiment of the phased array realizes LO beamforming by involving an example dual-loop PLL structure, which provides a lower cost frequency and phase control with the help of PDA. In addition, with a flexible structure design, this embodiment of the phased array can support reconfigurable number of elements with stable weighted transmitting power to fulfil an applications' requirement. The detail of the dual-loop structure as well as the beamforming realization with its potential applications would be described in detail as follows.

Example of the Dual-Loop PLL Structure

Figure 4:
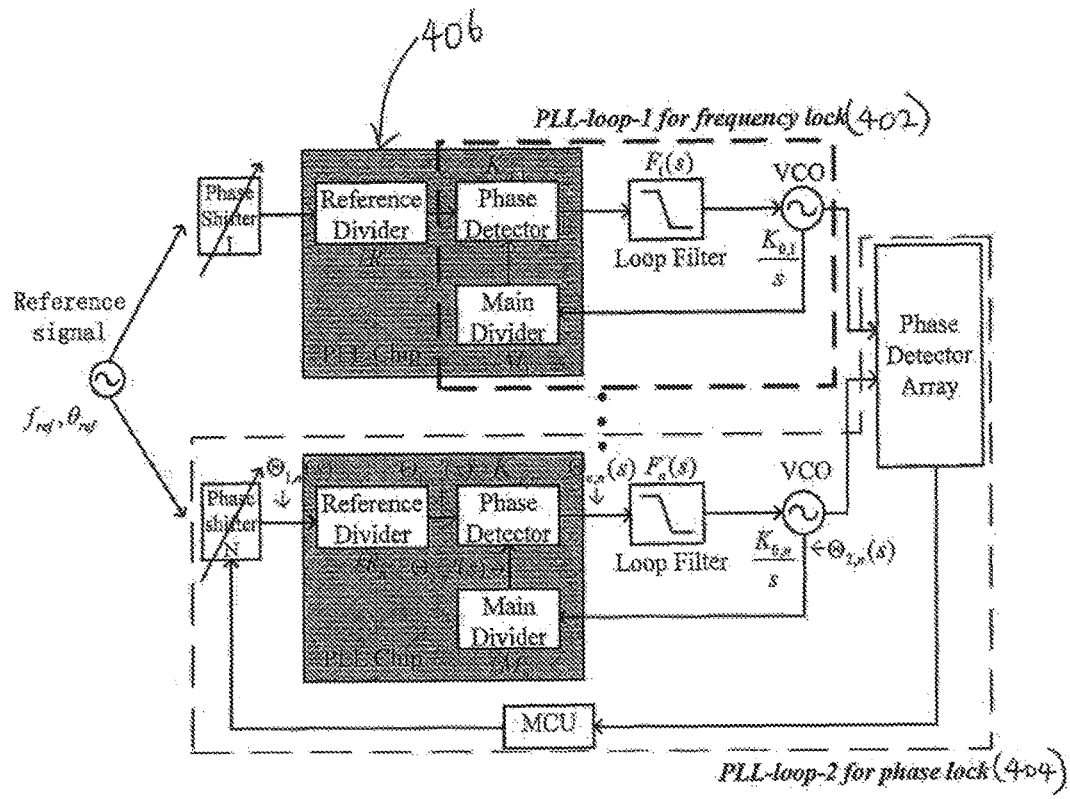
FIG. 4 is a block diagram of a dual loop infrastructure in accordance with another embodiment of the invention.

A method for phase control in each element of an open-loop phased source array is to create a look-up table for the switching voltage versus phase. This single-loop method provides a discrete phase change without error detection and compensation capability, which may cause serious performance degrading due to component aging and environmental problems. As a result, it may fail when involved in a phased array implementation. As shown in FIG. 4, in this embodiment, the system uses a dual loop structure so as to provide phase and frequency control with the first loop 402; then, it can also realize phase calibration, adjustment or shifting by the second loop 404, all the time during the operation period. As a result, it can detect and compensate the effect of the time variation of component characteristic to give an accurate phase locking performance.

1) First Loop:

In this embodiment, a PLL synthesizer 406, which consists of a reference divider, a phase detector with charge pump, a loop filter, a voltage controlled oscillator (VCO) and a main divider, works as the first loop 402. According to one theory researched by the inventors on PLL, if it is assumed that the PLL has locked and stayed locked for the near future, a linear mathematical model for the system can be developed as follows:

A phase-transfer function $H_n(s)$ for each element in FIG. 4 relates the phase $\theta_{1,n}'$ of the input signal to the phase $\theta_{2,n}'$ of the output signal of the $n^{th}$ phase detector:

$$H_n(s) = \frac{\Theta_{2,n}'(s)}{\Theta_{1,n}'(s)}, (n = 1, 2 \ldots N) \tag{3}$$

By involving the transfer functions of the individual building blocks in FIG. 4, Eq. (3) can be represented as:

$$H_n(s) = \frac{\Theta_{2,n}'(s)}{\Theta_{1,n}'(s)} = \frac{K_{0,n}K_{d,n}F_n(s)/M_n}{s + K_{0,n}K_{d,n}F_n(s)/M_n} \tag{4}$$

In addition to the phase-transfer function, an error-transfer function $H_{e,n}(s)$ is defined by $$H_{e,n}(s) = 1 - H_n(s) = \frac{s}{s + K_{0,n}K_{d,n}F_n(s)/M_n} \tag{5}$$

After choosing a passive lead-lag filter as the loop filter, whose transfer function is $$F_n(s) = \frac{1 + s\tau_{2,n}}{1 + s(\tau_{1,n} + \tau_{2,n})} \tag{6}$$

where $\tau_{1,n}=R_{1,n}C_n$, and $\tau_{2,n}=R_{2,n}C_n$. Substitute Eq. (6) into Eq. (4), one can get $$H_n(s) = \frac{\frac{K_{0,n}K_{d,n}}{M_n} \frac{1 + s\tau_{2,n}}{\tau_{1,n} + \tau_{2,n}}}{s^2 + s\frac{1 + K_{0,n}K_{d,n}\tau_{2,n}/M_n}{\tau_{1,n} + \tau_{2,n}} + \frac{K_{0,n}K_{d,n}/M_n}{\tau_{1,n} + \tau_{2,n}}} \tag{7}$$

If one follows the common practice in circuit and control theory to write the denominator of the transfer function in the normalized form, one may have $$\omega_{n,n} = \sqrt{\frac{K_{0,n}K_{d,n}}{M_n(\tau_{1,n} + \tau_{2,n})}}, \zeta_n = \frac{\omega_{n,n}}{2}\left(\tau_{2,n} + \frac{M_n}{K_{0,n}K_{d,n}}\right) \tag{8}$$

where $\omega_{n,n}$ is the natural frequency and $\zeta_n$ is the damping factor. After inserting these substitutions into Eq. (7), one may get the following phase-transfer function:

$$H_n(s) = \frac{s\omega_{n,n}\left(2\zeta_n - \frac{\omega_{n,n}}{K_{0,n}K_{d,n}/M_n}\right)}{s^2 + 2s\omega_{n,n}\zeta_n + \omega_{n,n}^2} \tag{9}$$

If the PLL system has a high gain loop, which most practical PLLs are, $K_{0,n}K_{d,n}/M_n \gg \omega_{n,n}$, so that Eq. (9) becomes:

$$H_n(s) \approx \frac{2s\omega_{n,n}\zeta_n + \omega_{n,n}^2}{s^2 + 2s\omega_{n,n} + \omega_{n,n}^2} \tag{10}$$

Similarly, the error-transfer function $H_{e,n}(S)$ would be:

$$H_{e,n}(s) \approx \frac{s^2}{s^2 + 2s\omega_{n,n}\zeta_n + \omega_{n,n}^2} \tag{11}$$

In principle, if one was to give the same value of the natural frequency $\omega_{n,n}$ and damping factor $\zeta_n$ to each element, one can get identical transfer functions to all the elements. While in practical, one can achieve it by building the same loop filters and setting the same dividing factors, i.e. $R_1=R_2= \ldots R_n=R, (n=1, 2 \ldots N)$ and $M_1=M_2= \ldots M_n=M, (n=1, 2 \ldots N)$. As a result, one can get:

$$\frac{\Theta'_{2,1}(s)}{\Theta'_{1,1}(s)} = \frac{\Theta'_{2,2}(s)}{\Theta'_{1,2}(s)} = \frac{\Theta'_{2,n}(s)}{\Theta'_{1,n}(s)}, (n = 1, 2 \ldots N) \quad (12)$$

Because all the elements share the same reference signal, if the phase shifters' effects are out of consideration temperately, one may have all the input signals' phase identical, i.e. $\Theta_{1,1}(s)=\Theta_{1,2}(s)=\Theta_{1,n}(s),(n=1, 2 \ldots N)$. As the transfer function for the reference divider is:

$$H_{R,n}(s) = \frac{\Theta'_{1,n}(s)}{\Theta_{1,n}(s)} = \frac{1}{R}, (n = 1, 2 \ldots N) \quad (13)$$

So that $\Theta_{1,1}'(s)=\eta_{1,2}'(s)=\Theta_{1,n}'(s),(n=1, 2 \ldots N)$. Then one can get the result from Eq. (12) that $\theta_{2,1}'(s)=\Theta_{2,2}'(S)=\Theta_{2,n}'(s),(n=1, 2 \ldots N)$. As the transfer function for the main divider is:

$$H_{M,n}(s) = \frac{\Theta'_{2,n}(s)}{\Theta_{2,n}(s)} = \frac{1}{M}, (n = 1, 2 \ldots N) \quad (14)$$

So that $\Theta_{2,1}(s)=\Theta_{2,2}(s)=\Theta_{2,n}(s),(n=1, 2 \ldots N)$, which means the output signals' frequency can be synchronized to be the same because frequency is just the derivative of phase.

2) Second Loop:

In this embodiment, to control the phase difference between the adjacent elements of the multi-element array, another loop 404, which involves a phase shifter to generate phase difference at reference frequency is preferred. This is because a PLL cannot provide a phase control function if the same frequency is maintained. If a phase step due to the phase shifter at time t=0 is applied, the phase signal $\theta_{1,n}(t)$ is a step function, $$\theta_{1,n}(t)=u(t)\cdot\Delta\Phi_n \quad (15)$$

Where u(t) is the step function and $\Delta\Phi_n$ is the size of the phase step to the $n^{th}$ element.

For the Laplace transform $\Theta_{1,n}(S)$ one may get is:

$$\Theta_{1,n}(s) = \frac{\Delta\Phi_n}{s} \quad (16)$$

Thus the phase error $\theta_{e,n}$ is obtained from $$\Theta_{e,n}(s) = H_{e,n}(s) \cdot \Theta_{1,n}(s) = H_{e,n}(s) \cdot \frac{\Delta\Phi_n}{s} \quad (17)$$

Substituting Eq. (11) into Eq. (17) yields $$\Theta_{e,n}(s) = \frac{s^2}{s^2 + 2s\omega_{n,n}\zeta_n + \omega_{n,n}^2} \cdot \frac{\Delta\Phi_n}{s} \quad (18)$$

For the steady-state situation again, one may have the final phase error $\theta_{e,n}(\infty)$ approaches zero according to the final value theorem of the Laplace transform, which reads $$\theta_{e,n}(\infty) = \lim_{s \to 0} s\Theta_{e,n}(s) = 0 \quad (19)$$

The transient phase step response of the PLL in the locked state shows us the tracking performance of the PLL, which is in the form that the output signal's phase can be changed with the change to the input reference signal's phase.

As a result, if $\Delta\Phi_n$ is applied by the phase shifter at reference signal with frequency $f_{ref}$, and the output signal's phase difference due to the tracking performance is $\Delta\Phi'_n$, according to Eq. (13) and (14), at the steady-state situation, one may get a relation as $$\frac{\Delta\Phi'_n}{M_n} = \frac{\Delta\Phi_n}{R_n} \quad (20)$$

Figure 5:
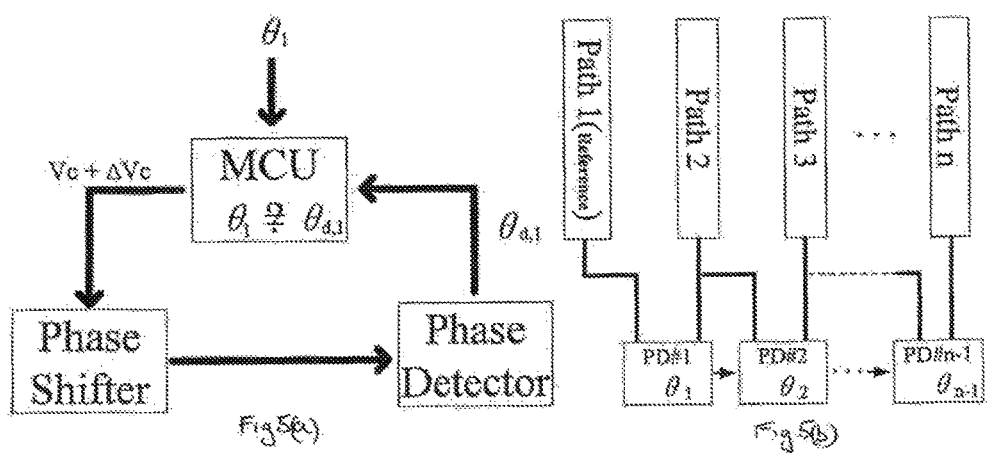
FIG. 5A is a block diagram of a phase control for a single path.
FIG. 5B is a block diagram of phase control for multiple paths.

So that one can achieve a large phase shift $\Delta\Phi_n'$ at high frequency by providing a small phase shift $\Delta\Phi_n$ at the reference frequency (which is generally in order of 10 MHz) as M>>R. Then the phase detector array detects the phase difference between the adjacent elements' output signals, and the consequent error voltage, which represents $\theta_{d,n-1}=\Delta\Phi_n'-\Delta\Phi_{n-1}',(n=2, 3 \ldots N)$, would be detected by MCU. Based on this phase information, MCU would send a DC control voltage to control the phase shifter for a proper phase shift achieved. FIG. 5 shows the phase control procedures in both single path and multiple paths. According to FIG. 5(a), a target $\theta_1$ is firstly set to MCU and it will give an initial control $V_c$ to the phase shifter. Then an adjustment $\Delta V_c$ on control voltage will be given after the detected phase difference $\theta_{d,1}$ compared with $\theta_1$ by MCU. It would be repeated until $\theta_{d,1}=\theta_1$ achieved. According to FIG. 5(b), multiple paths' phase control would be accomplished in a sequence of path 2, path 3 up to path n if path 1 works as reference. In such a manner, constant monitoring on the phase control performance as well as fine adjustments can be realized.

In some embodiments, the phased array has a capability to steer its main-beam to a desired direction $\theta_n$ if proper phase difference and location distance exist between its adjacent antenna elements. In this amendment phased array realizes beamforming by providing phase controllable LO signals in a way that generate a small phase shift at low frequency to provide a large phase shift at high frequency. This method can reduce the cost of phase shift significantly when compared with other phase shift methods in the conventional phased array. In addition, continues phase shift at low frequency can be easily made so that continues phase shift at high frequency obtained by our method has its advantage of minimizing the phase quantization error, which is mainly caused by discrete phase shift. Although varactor type phase shifter's resolution is limited by the control voltage, which is provided by the MCU with a certain RAM size, e.g. 12 bits in one example, it can still fulfills the requirement of the beamforming resolution due to very fine phase shift at low frequency is processed. As a result, accurate beamforming with high resolution application can be realized.

As shown in FIG. 3, the MCU controlled VGAs in the transmitting paths can provide uniform power to the array elements for a high array gain realization and also provide non-uniform power feeding for side-lobe suppression realization, which is more suitable for the applications where the communication capacity is important. In addition, because the nulls of the radiation pattern can also be formed in the direction of undesired wave by controlling only the phase excitation without affecting the main beam, this embodiment of the phased array is also a good alternative to realize such null control application.

In this embodiment of the phase array belongs to active phased arrays, which may suffer from active transmit/receive (T/R) module failure due to component aging problem and other reasons. However, in contrast to a passive array, a module failure in an active array does not have disastrous consequences, but usually expressed in terms of degradation of radiation pattern. In order to compensate for such degradation before the replacement of the failure T/R modules, techniques may be derived but due to its capability of phase shifting and power control. In this embodiment of the array, it can be realized such a practical failure compensation application by applying the phasor rotation method described above.

Some of the applications described above are realized by the embodiment of the phased array with example demonstration results shown below.

For the purpose of demonstrating one embodiment of the invention, a four-element phased transmitter array has been constructed by using electrical components. In this section, the architecture of one embodiment of the transmitter will be discussed. This is followed by the performance analysis of some major components in the transmitter.

Figure 6:
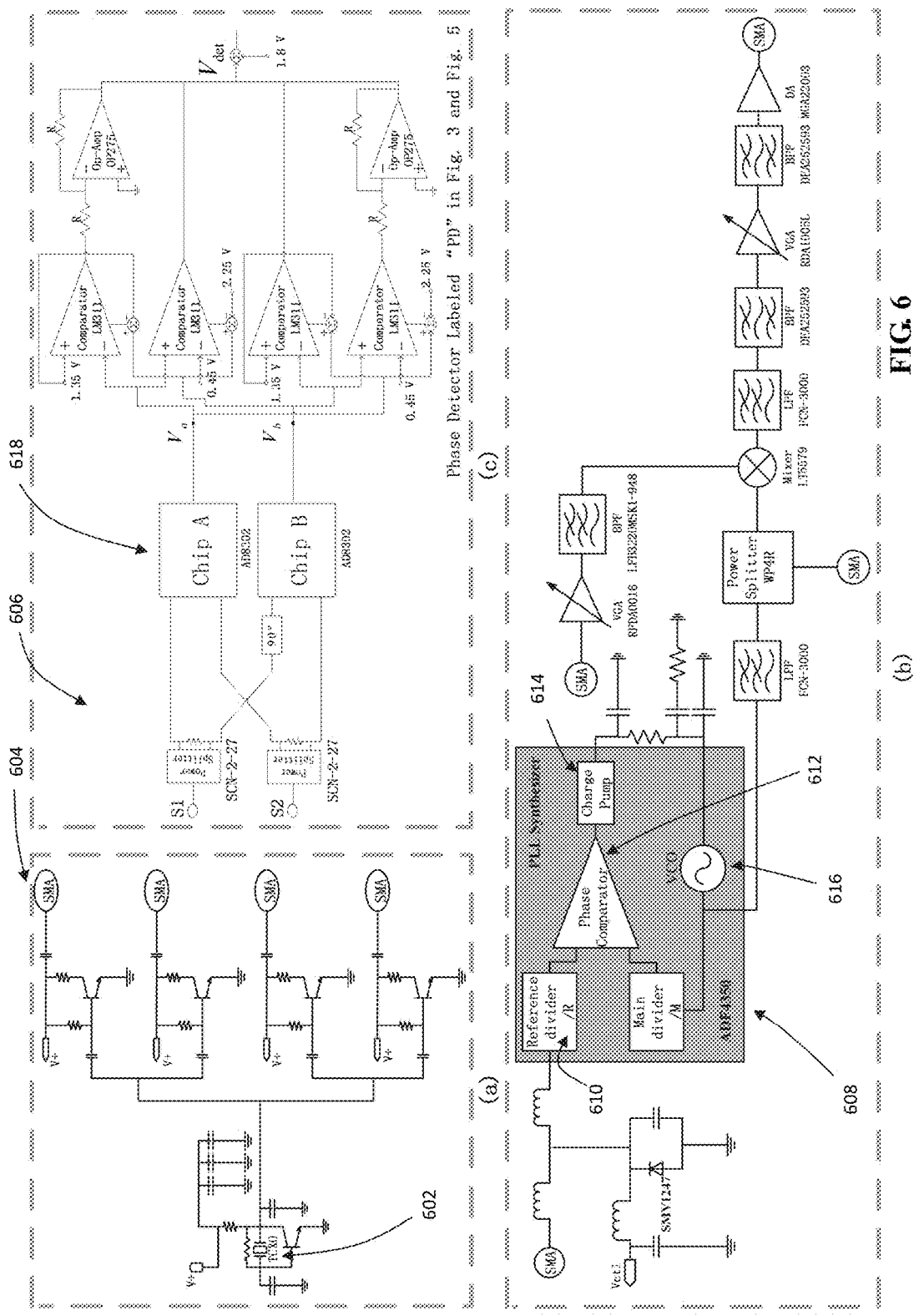
FIG. 6A is a schematic diagram of a crystal oscillator on a master board.
FIG. 6B is a schematic diagram of a transmitter element.
FIG. 6C is a schematic diagram of a phase-detecting block.

A single path transmitter schematics are shown in FIG. 6 and the details about each component in the transmitter element would be described in a sequence of LO path circuits, IF path circuits, RF path circuits and MCU as follows.

LO Path Circuits

1. Crystal Oscillator:

As shown in FIG. 6(*a*), in a master board, a 26 MHz reference signal is generated by a TCXO type crystal (XTAL) oscillator 602 with ultra high temperature stability and very low phase noise level. This signal is divided into four paths 604 with equal length and ended with a buffer amplifier for isolation to the later stages at each path before going into the frequency synthesizer as the reference signal.

Figure 7:
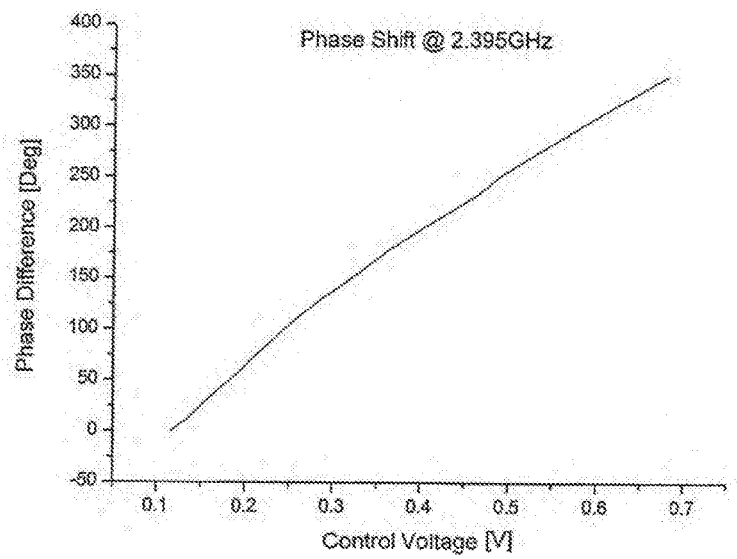
FIG. 7 is a chart illustrating the performance of an example Low Frequency Phase Shifter (LFPS)

2. Low Frequency Phase Shifter (LFPS):

A varactor type phase shifter (SMV1247) 606 is employed at the reference signal before the frequency synthesizer to realize continues phase shift, which is controlled by MCU via a DC control voltage. A small phase shift at reference frequency will produce 0° to 360° phase shift at high frequency, which is measured and shown in FIG. 7. Its accuracy can be verified with its capacitance versus reverse voltage information in its datasheet. Since it only takes a short range of capacitance variation for a small phase shift at low frequency, it can be quite linearly controlled. As the MCU has an internal 12-bit DAC module, a resolution of the control voltage as 0.53 mV can be achieved.

Figure 8:
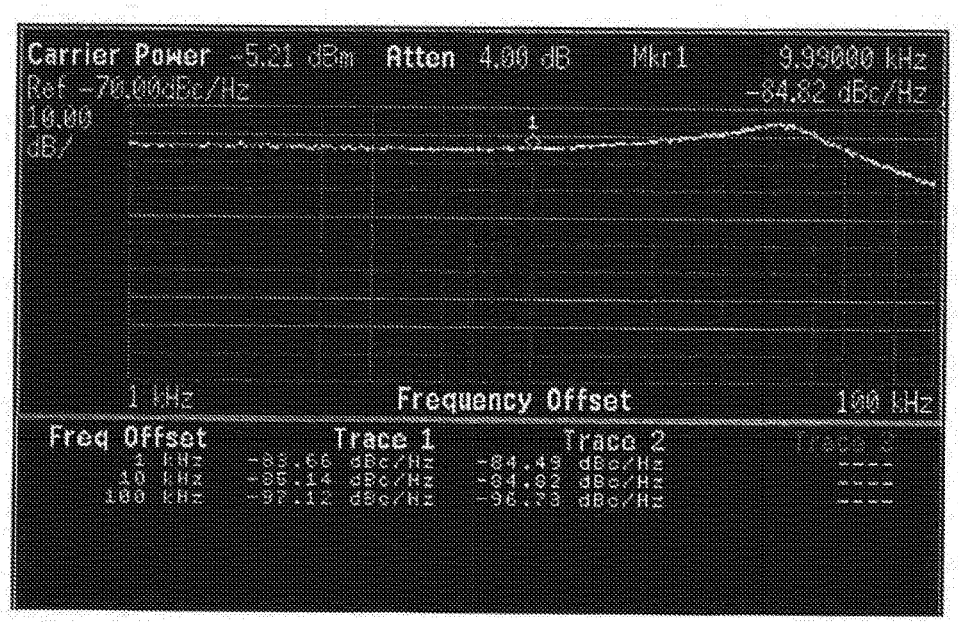
FIG. 8 is a screen printout illustrating the measured single path phase noise.

3. Frequency Synthesizer:

As shown in FIG. 6(*b*), a PLL synthesizer (ADF4350) 608 consists of a reference divider 610, phase comparator 612 with charge pump 614, VCO 616 and main fractional-N divider 610. With an external passive $3^{rd}$ order loop filter involved, it can lock the output signal to 2.395 GHz if R and M are properly set by MCU. A tradeoff between noise spurs and locking time should be considered by optimizing the passive loop filter to give an acceptable phase noise level. FIG. 8 shows the measured phase noise for two single-path modules of this embodiment of a transmitter. From the performance, it can be observed that these two modules have similar phase noise performances as labeled by trace 1 and trace 2 separately. Compared with the standard phase noise level of ADF4350 in its datasheet, our measured single-path phase noise performance is acceptable.

Figure 9:
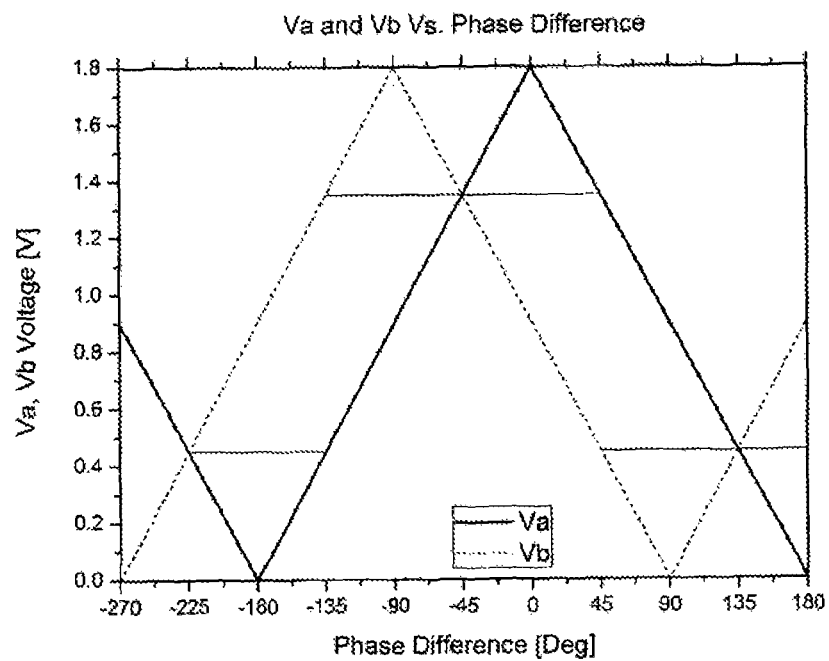
FIG. 9 is a chart illustrating an ideal output voltage vs. phase difference curve of analogue devices AD8302 phase detectors when configured as in FIG. 6C.

4. Phase Detector Array:

As shown in FIG. 6(*b*), the 2.395 GHz LO signal from the PLL synthesizer would be split into two/three (two for elements at two ends and three for the other elements of the array) paths by the power splitter (WP4R), one path is for up conversion in the Tx path, and the others are for phase detection in the feedback loop. In our system, the phase detection involves a novel concept of phase detector array, which consists of bilateral phase-detecting blocks measuring the phase difference between the adjacent LO signals. FIG. 6(*c*) shows a schematic of the phase-detecting block. Signals from Ports S1 and S2 are split by a 1:2 power splitter, and then feed phase detectors (AD8302) 618. Two chips are needed to improve the phase detection's accuracy and to achieve a maximum detection range of 360° because a single chip AD8302 has large error for the phase detection near 0° and ±180° and it also has a maximum detection range of 180° only. Chip A samples S1 and S2, while Chip B samples S2 and a 90° delayed version of S1. According to the error analysis of a single chip AD8302 from its datasheet, it implies that one should avoid the detection range near 0° and ±180° due to catastrophic error. FIG. 9 shows an ideal output voltage vs. phase difference response and it can be seen that if the total detection range changes from −180°~180° to −225°~135°, which still maintains 360° phase detection, it can be divided into four sub ranges, each involves an accurate phase detection of a single AD8302 chip while the other chip's output voltage works for sub range selection. For example, if $V_a \leq 0.45V$, Chip B's output voltage should be used as the detected voltage because its error is small within that range. While if $V_b \geq 1.35V$, Chip A's output voltage should be used as the detected voltage. Hence the full −225°~135° range may be obtained by:

$$V_{det} = \begin{cases} V_b - 2.25, & V_a \leq 0.45 \text{ V} \\ V_a - 1.35, & V_b \geq 1.35 \text{ V} \\ 1.35 - V_b, & V_a \geq 1.35 \text{ V} \\ 2.25 - V_a, & V_b \leq 0.45 \text{ V} \end{cases} \quad (21)$$

Where $V_{det}$ is the detected voltage proportional to the phase difference and has the range of −1.8 V to 1.8 V.

Figure 10:
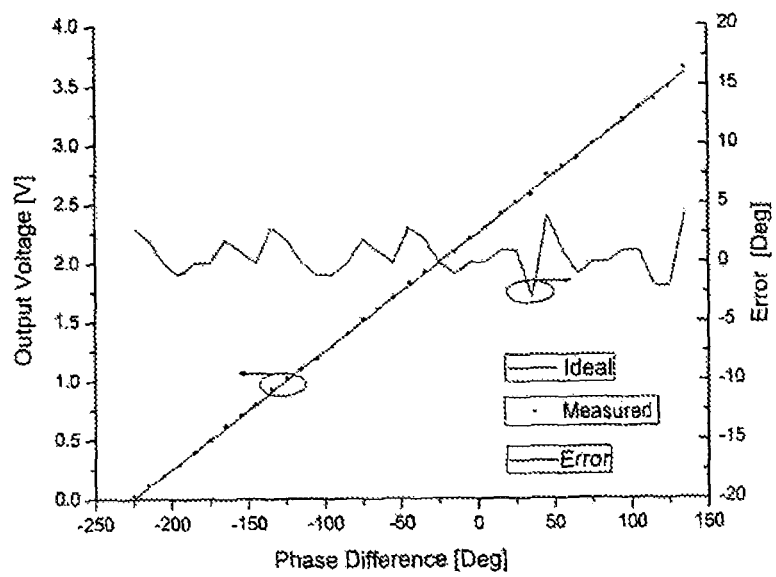
FIG. 10 is a chart illustrating the measured and ideal performance of the phase-detecting block.

$V_{det}$ is physically obtained by using op-amps and comparator circuits shown in FIG. 6(*c*), where four comparators are in parallel and corresponding to four sub ranges. For each comparator, if the requirement is fulfilled, the comparator outputs whatever its V-connected to, where Eq. (21) is for the case of this circuit. Otherwise, the comparator's output is open circuit. Only one comparator outputs non-zero voltage at each time because the four sub ranges are never overlapped. To match the MCU detection range, $V_{det}$ should be shift up by 1.8V to be a non-negative value with the help of an op-amp. The measured performance of the phase-detecting block is shown in FIG. 10 with a comparison to its ideal performance and agreement is achieved. However, due to the error of 90° phase shifter as well as voltage comparators in the phase-detecting blocks, phase detection at boundary conditions suffers from larger error compared with other phases, but it achieves an acceptable error within ±4° for the whole 360° range by eliminating the very large error region of a single detector chip.

IF Path Circuits

A 200 MHz IF signal is directly provided by a vector signal generator (SMU200A). It flows through a VGA (RFDA0045) for amplitude control, as shown in FIG. 6(b). It then goes through a bandpass filter (LFB3220MSK1-948) before going into the up-converter.

RF Path Circuits

As shown in FIG. 6(b), the 200 MHz IF signal and the 2.395 GHz LO signal are mixed by a mixer (LT5579) to generate a 2.595 GHz RF signal for transmission. After passing a low pass filter (FCN3000) and a band pass filter (DEA252593), it would be amplified by a MCU controlled VGA (RDA1005L) for amplitude control. Finally, after amplified by a drive amplifier (MGA22003), the RF signal is send to an antenna element.

Microcontroller Unit (MCU)

Each transmitter element has an individual MCU (STM32F207), which is in charge of setting the PLL synthesizer and implementing phase control as well as amplitude control. There is another MCU in the master board used for synchronization of the four MCUs.

Example Experimental Results

Figure 11:
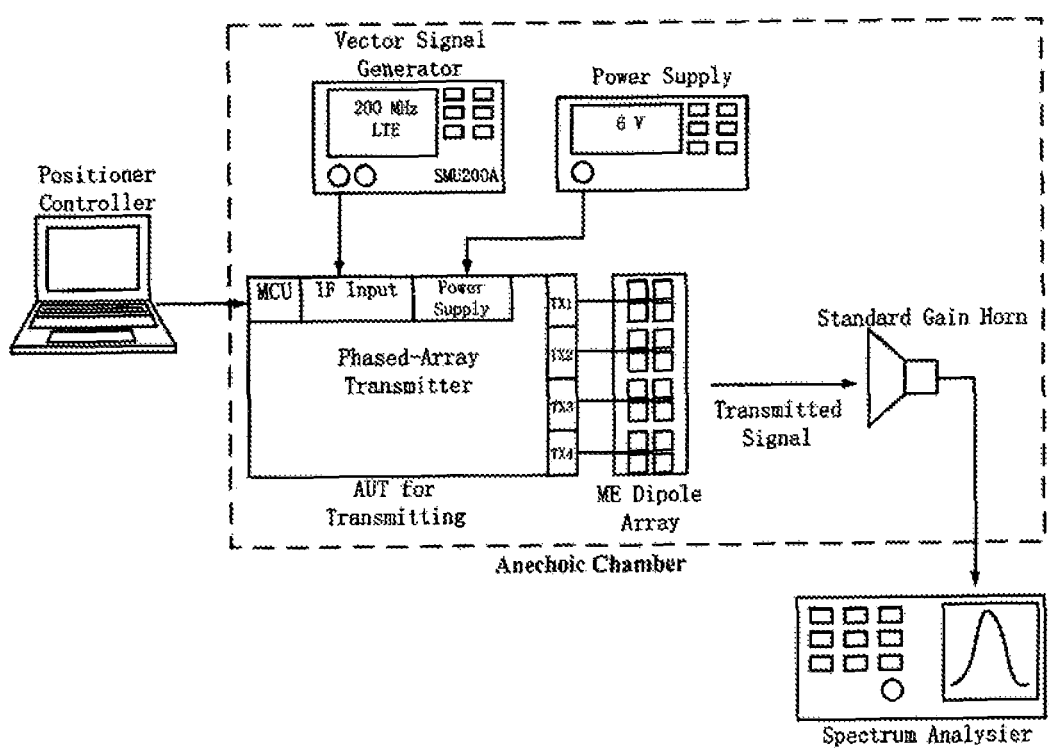
FIG. 11 is a schematic diagram of an array measurement setup.

In this embodiment, the phased transmitting array has four elements and it is implemented using electronic components mounted on a FR4 printed circuit boards (PCBs) with a dielectric constant $\in_r$=4.6 and height h=1.6 mm. The phased transmitter array is connected to a 4×1 dual-polarized magneto-electric (ME) dipole antenna array with odd ports fed. The block diagram of the far-field array measurement in anechoic chamber setup is shown in FIG. 11. A laptop works as the positioner controller, which is used to vary the phased array steering angle and feeding power. A signal generator (SMU200A) provides the baseband signal as IF signal to the phased array. After powered up by a power supply with a 6V DC voltage, the phased-array transmits the signal, which can be received by a standard gain horn and then be recorded by a spectrum analyzer (E4448A).

Figure 12:
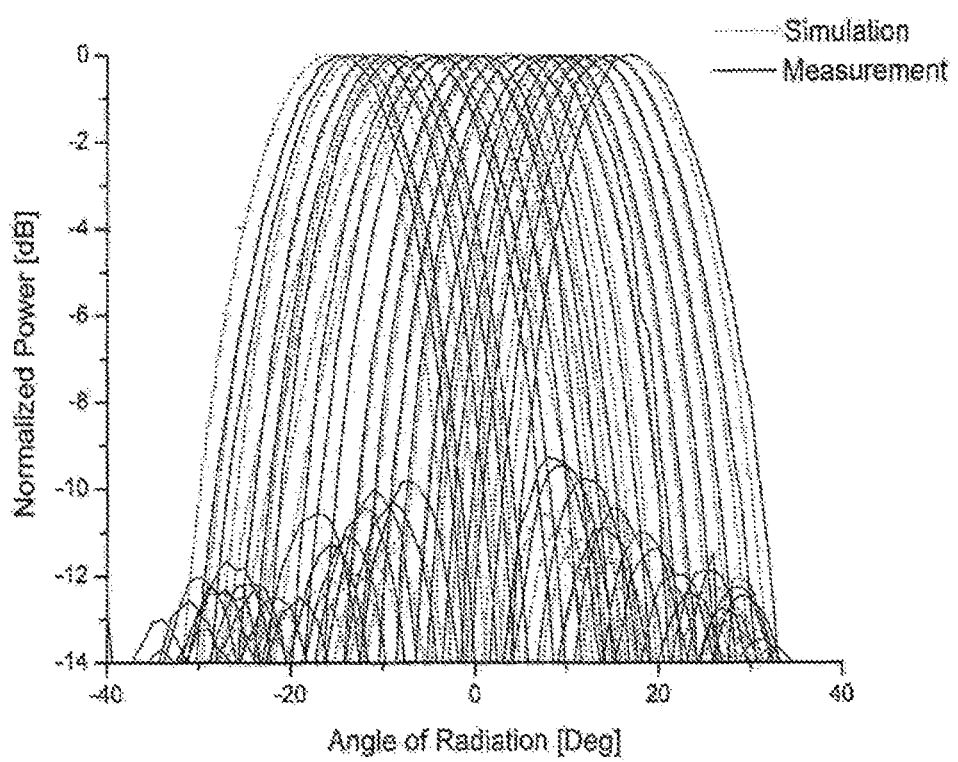
FIG. 12 is a chart illustrating the simulated and measured in phase radiation pattern performance.

As shown in FIG. 12, the simulated and measured array's beamforming performance in terms of radiation pattern and a good agreement is achieved. Furthermore, it also agrees with the theoretical beam tilt angle in Eq. (2). It shows a beam tilt range from −17° to +17° when the adjacent phase difference changes from −90° to +90°. It also shows this embodiment of the transmitter array's beamforming resolution, i.e. minimum beam tilt angle $\theta_B$=20 with the minimum progressive phase difference $\Delta\varphi_B$=10°.

Figure 13:
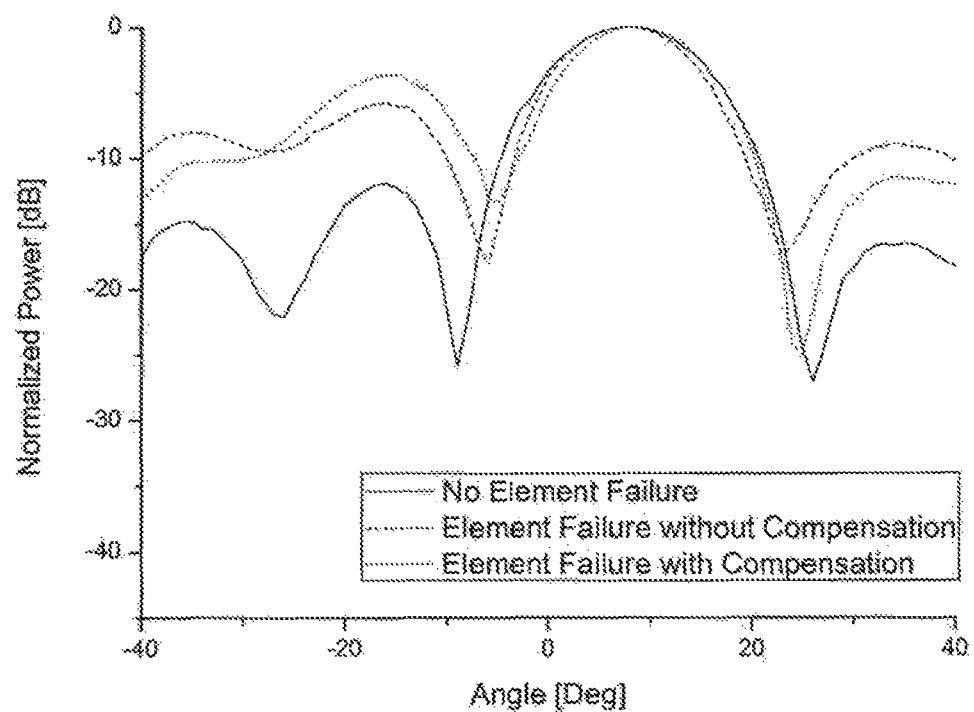
FIG. 13 is a chart illustrating the practical element failure compensation measured in phase radiation pattern; and, FIG. 14 is a graph illustrating the constellation diagram of EVM test for LTE TDD BPSK, QPSK, 16-QAM and 64-QAM modulation.

FIG. 13 depicts the self-compensation realization with the phasor rotation method applied. Solid line curve shows the normal radiation pattern when beam tilt angle $\theta_B$=8°. Dash line curve shows the radiation pattern when the second element fails to transmit enough power so that it has sidelobe degradation. Dot line curve shows the compensated radiation pattern with the phasor rotation method applied. The first and third elements' phases are changed 15° apart from their original values and 1.5 dB extra powers are added to them. It can only compensate either upper or lower sidelobe degradation by sacrificing the other.

Figure 14:
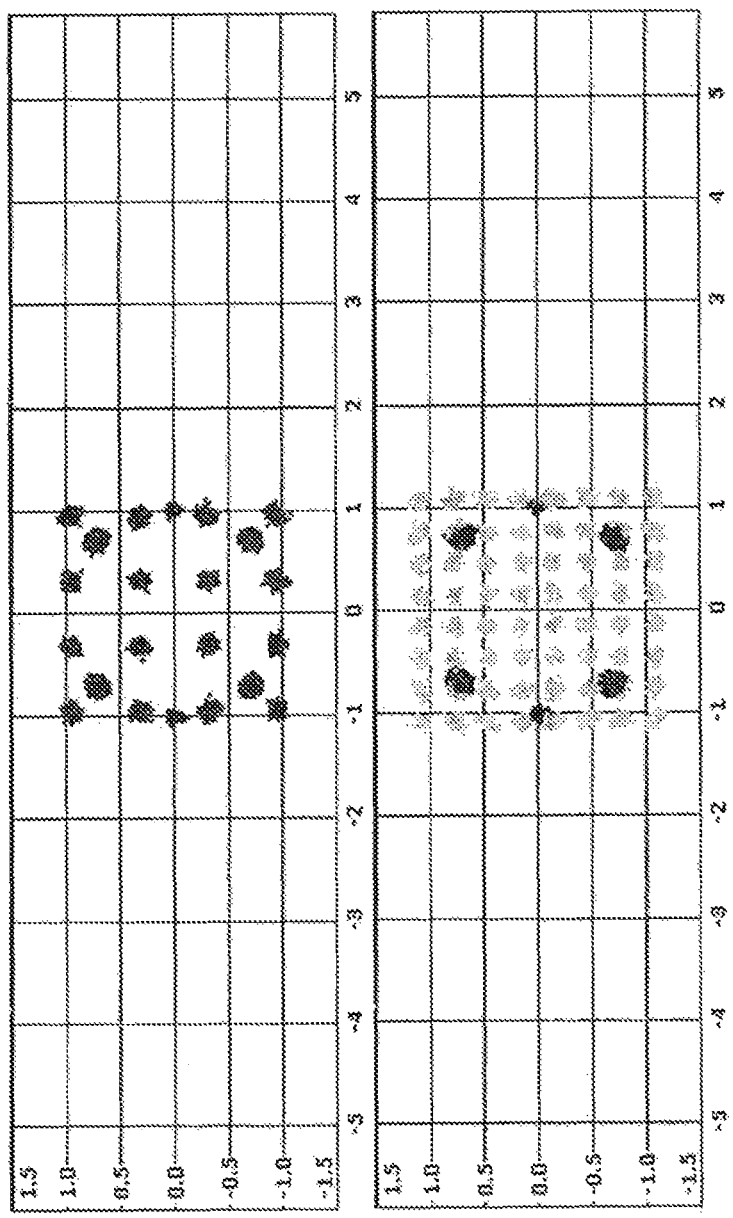

In some instances, the baseband modulating signals adding up coherently would result a signal distortion that is manifested as a higher error vector magnitude (EVM). As a result, EVM test for a phased array is necessary and important for practical use. One may use a vector signal generator (VSG) to generate different type's modulated LTE TDD IF signal to an embodiment of the transmitter and use a vector signal analyzer (VSA) to measure and calculate the EVM values. FIG. 14 shows the constellation diagram of the EVM test of the phased array without PA in BPSK, QPSK, 16-QAM and 64-QAM modulation respectively. The calculated EVM values are 5.13%, 5.15%, 5.67%, and 5.97% respectively, which all fulfill 3GPP LTE downlink EVM minimum requirement as 8%.

Due to the high cost of phase shift at high frequency, especially millimeter wave (MMW), this embodiment of the dual-loop PLL-based frequency and phase control makes it a good candidate for MMW communication system because it can realize purely analog phase shift at low frequency to achieve the phase shift at high frequency with an accurate feedback control. Although only an S band demonstration has been done to this embodiment of the coherent-source array, moving into higher frequency range would be our future work.

As demonstrated, a dual-loop PLL-based coherent-source array has been implemented with a demonstration of a four-element array fabricated and measured. The basic phased array principle is described with a theoretical beam-steering equation obtained. These embodiments are advantageous in that the dual-loop low cost frequency and phase control approach adopted in the transmitter achieves a good beam-steering resolution as 2° for a total steering range of 34° and also a good agreement among measured, simulated and theoretical beam tilt performance is reached. Element failure compensation is demonstrated by applying phaser rotation method. Practical LTE modulation EVM test is executed with results all fulfil 3GPP's requirement.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A control circuit for an antenna array, comprising:
a signal source arranged to generate a reference signal with a phase;
three or more phase shifters connected with the signal source, each of the three or more phase shifters being arranged to process the reference signal and to output a respective phase-shifted signal;
three or more frequency locking circuits each connected with a respective phase shifter to receive and process the respective phase-shifted signal, each of the three or more frequency locking circuits comprises an oscillator arranged to provide an output signal to a respective transmitter circuit of a respective antenna element, the three or more frequency locking circuits being arranged to synchronize a frequency of the output signals; and
a phase control circuit connected between the three or more oscillators and the three or more phase shifters, wherein the phase control circuit comprises:
a phase detector array with two or more phase detectors, each arranged to determine a phase difference between the two adjacent output signals; and
a processor arranged to receive the determined phase differences, to compare the determined phase differences with a respective reference phase difference, and to output a respective phase compensation signal to respective phase shifters;
wherein the number of oscillators is more than the number of phase detectors by one.

2. The control circuit of claim 1, wherein the three or more frequency locking circuits are PLL-based frequency locking circuits.

3. The control circuit of claim 1, wherein each frequency locking circuit further comprises a PLL synthesizer connected with the respective phase shifter, and the respective oscillator is arranged to provide a feedback signal to the PLL synthesizer for frequency control.

4. The control circuit of claim 3, wherein the PLL synthesizer comprises a reference divider, a phase detector, and a main divider; the reference divider and the phase detector being connected in series between the phase shifter and the oscillator.

5. The control circuit of claim 3, wherein each frequency locking circuit further comprises a filter connected in series between the PLL synthesizer and the oscillator.

6. The control circuit of claim 1, wherein the oscillators are voltage controller oscillators.

7. The control circuit of claim 1, wherein at least two of the phase-shifted signals are of different phases.

8. The control circuit of claim 1, wherein the oscillators are radio frequency oscillators and the output signals are radio signals.

9. The control circuit of claim 1, wherein each frequency locking circuit defines a first circuit loop.

10. The control circuit of claim 1, wherein each phase shifter, the respective frequency locking circuit and the phase control circuit together defines a second circuit loop.

11. The control circuit of claim 1, wherein the respective reference phase difference is predetermined.

12. The control circuit of claim 1, wherein the respective reference phase difference is adjustable.

13. The control circuit of claim 1, wherein each transmitter circuit comprises a filter and an amplifier.

14. An antenna array comprising:
three or more antenna elements;
three or more transmitter circuits each connected with a respective antenna element;
a signal source arranged to generate a reference signal with a phase;
three or more phase shifters connected with the signal source, each of the plurality of phase shifters is arranged to process the reference signal and to output a respective phase-shifted signal;
three or more frequency locking circuits each connected with a respective phase shifter to receive and process the respective phase-shifted signal, each of the three or more frequency locking circuits comprises an oscillator arranged to provide an output signal to the respective transmitter circuit of the respective antenna element, the three or more frequency locking circuits being arranged to synchronize a frequency of the output signals; and
a phase control circuit connected between the three or more oscillators and the three or more phase shifters, wherein the phase control circuit comprises:
a phase detector array arranged to determine phase differences between at least two adjacent output signals; and
a processor arranged to receive the determined phase differences, to compare the determined phase differences with a respective reference phase difference, and to selectively output a respective phase compensation signal to a respective phase shifter based on the comparison result;
wherein the number of oscillators is more than the number of phase detectors by one.

15. The control circuit of claim 1, further comprising three or more power splitters each arranged between a respective oscillator of the frequency locking circuit and a respective transmitter circuit of the respective antenna element, the power splitter being arranged to provide a major power of the output signal to the transmitter circuit of the antenna element, and to provide a minor power of the output signal to the phase control circuit.

16. The antenna array of claim 14, further comprising three or more power splitters each arranged between a respective oscillator of the frequency locking circuit and a respective transmitter circuit of the respective antenna element, the power splitter being arranged to provide a major power of the output signal to the transmitter circuit of the antenna element, and to provide a minor power of the output signal to the phase control circuit.

\* \* \* \* \*